United States Patent [19]

Sowadski

[11] Patent Number: 5,179,728
[45] Date of Patent: Jan. 12, 1993

[54] SPURIOUS PRODUCT AND LOCAL OSCILLATOR RADIATION SUPPRESSION SYSTEM FOR USE IN SUPERHETERODYNE RADIO RECEIVERS

[75] Inventor: Robert A. Sowadski, Marion, Iowa
[73] Assignee: Rockwell International Corporation, Seal Beach, Calif.
[21] Appl. No.: 767,736
[22] Filed: Sep. 30, 1991
[51] Int. Cl.$^5$ ............................................. H04B 1/10
[52] U.S. Cl. ................................ 455/183.1; 455/260; 455/314; 455/317
[58] Field of Search ............... 455/324, 183, 260, 314, 455/317, 344, 183.1, 183.2

[56] References Cited

U.S. PATENT DOCUMENTS

| | | | |
|---|---|---|---|
| 2,993,958 | 7/1961 | Barnes | 455/324 |
| 4,893,316 | 1/1990 | Janc et al. | 455/324 |
| 5,033,110 | 7/1991 | Harman | 455/317 |

FOREIGN PATENT DOCUMENTS 0084508  5/1983  Japan .................. 455/317

Primary Examiner—Reinhard J. Eisenzopf
Assistant Examiner—Timothy H. Keough
Attorney, Agent, or Firm—John J. Horn; M. Lee Murrah; H. Frederick Hamann

[57] ABSTRACT

A system for suppressing spurious product signals and radiation resulting from the leakage of local oscillator signal energy in superheterodyne radio receivers. The system includes a 0° signal splitter, a 180° signal splitter, a pair of mixers and a 180° signal combiner. The splitters split the communications input signal and local oscillator signal into signal components which are mixed together in the mixers to form intermediate frequency components which are combined in the combiner.

15 Claims, 2 Drawing Sheets

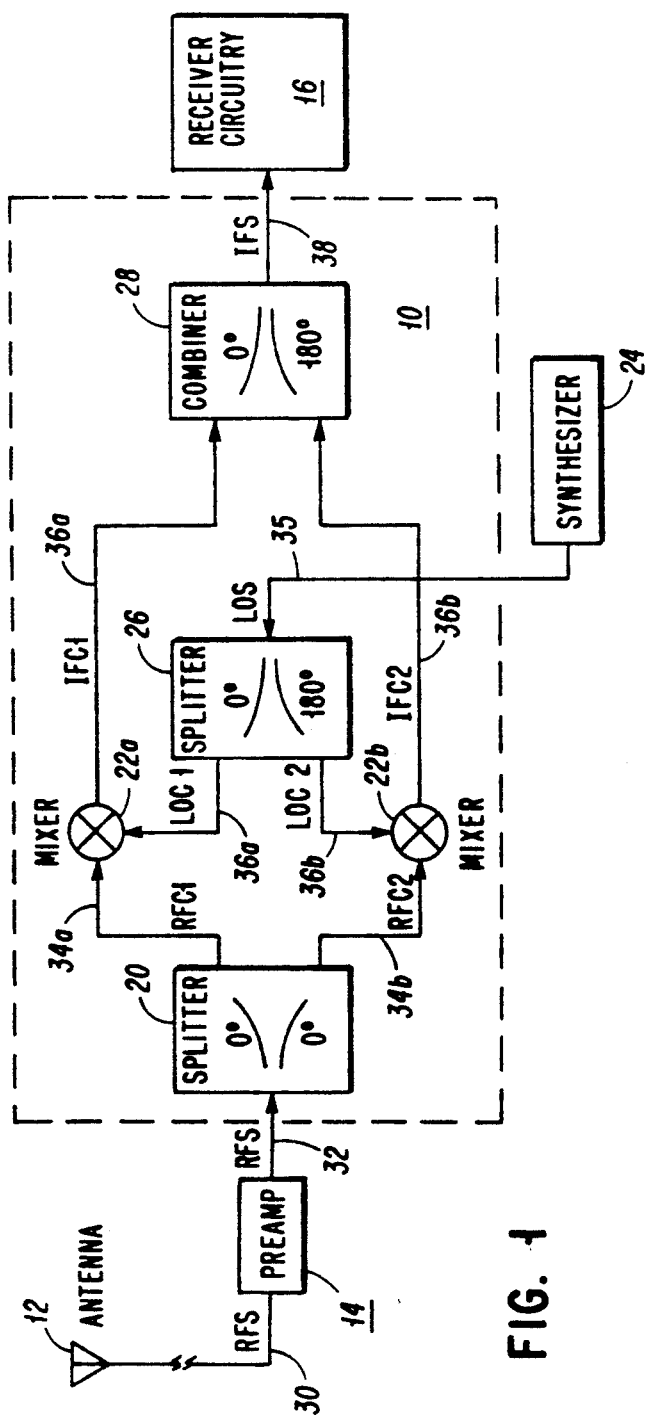
FIG. 1
FIG. 2
FIG. 3

SPURIOUS PRODUCT AND LOCAL OSCILLATOR RADIATION SUPPRESSION SYSTEM FOR USE IN SUPERHETERODYNE RADIO RECEIVERS

BACKGROUND OF THE INVENTION

The present invention relates to superheterodyne radio receivers and more particularly to systems for suppressing spurious signals in superheterodyne receivers.

In accordance with the operational fundamentals of superheterodyne receivers, communications input signals across frequency bands of interest are mixed with a tuneable local oscillator signal to produce a constant intermediate frequency signal. However, because the mixers employed in this process are inherently non-linear devices harmonics of the input signals and of the local oscillator signal are generated during the mixing process and are likewise mixed resulting in signal products having frequencies as defined by expression 1 below:

$$\pm(Nxf_{RF}) \pm (Mxf_{LO}) \qquad (1)$$

where:

N and M are zero or positive integers, $f_{RF}$ is the frequency of the radio frequency communications input signal, and $f_{LO}$ is the frequency of the local oscillator signal to be mixed with the input signal.

Depending upon the input frequencies of interest, the intermediate frequency chosen and the local oscillator frequency selected (i.e. the conversion scheme for the receiver), certain spurious products generated pursuant to the mixing process may fall within or close to the intermediate frequency passband for the receiver thereby creating undesirable interference with the communication signal.

Superheterodyne receivers are frequently subject to a separate problem in that the local oscillator signal, which is usually a high level signal, is passed through the mixer and is radiated out through the receiver's antenna. Although the local oscillator signal reaching the antenna is attenuated to the extent of the mixer isolation, nevertheless, enough radiation can leak through to cause troublesome interference problems for nearby receivers. Furthermore, sufficient signal energy can occasionally be leaked out to allow the receiver's location to be identified which can be highly undesirable in some military applications.

These problems have been dealt with in the past by making good choices for the frequency conversion scheme used in the receiver, providing mixers having good balance and isolation and filtering the input to the mixer. However, in wideband applications it is difficult to resolve these problems using these techniques and the solutions which can be obtained are only partially effective.

It is therefore an object of the present invention to provide a system for suppressing spurious product signals arising during the mixing process in superheterodyne radio receivers.

It is another object of the present invention to provide a system for reducing the amount of radiation emitted from superheterodyne receivers due to leakage of the local oscillator signal through the mixer to the receivers input antenna.

It is a further object of the present invention to provide a system for suppressing mixer generated spurious product signals and local oscillator leakage radiation which is effective yet is simple and economical to implement.

SUMMARY OF THE INVENTION

The present invention constitutes a system for use in a superheterodyne receiver for suppressing spurious product signals resulting from the mixing process and reducing the level of radiation leakage due to signal energy from the local oscillator being passed through the mixer to the input circuitry of the receiver. The system includes an equal amplitude 0° signal splitter, a pair of radio frequency mixers, an equal amplitude 180° signal splitter and a equal amplitude 180° signal combiner. The 0° splitter splits the radio frequency communications signal received by the receiver into equal amplitude and inphase components. The 180° splitter splits the local oscillator signal from the receiver's synthesizer into equal amplitude but 180° out-of-phase components. The radio frequency mixers separately mix the components of the local oscillator signal with the components of the communications input signal to form a pair of intermediate frequency components. The 180° combiner combines these intermediate frequency components to generate a single intermediate frequency signal which is then supplied for further processing by the receiver's conventional intermediate frequency circuitry. The configuration of the suppression system allows for cancellation of certain spurious products generated during the mixing process in the radio frequency mixers and enables cancellation of local oscillator signals which may leak through the radio frequency mixers into the input circuitry of the receiver.

BRIEF DESCRIPTION OF THE DRAWINGS

FIG. 1 provides a block diagram of the present invention showing the components making up the present invention and their relationship to the overall receiver.

FIG. 2 provides a schematic diagram of a 0° equal amplitude signal splitter of the type which could be used as a component of the present invention.

FIG. 3 provides a schematic diagram of a 180° signal splitter or combiner of the type which could be used as a component of the present invention.

DESCRIPTION OF THE PREFERRED EMBODIMENT

Figure 4:
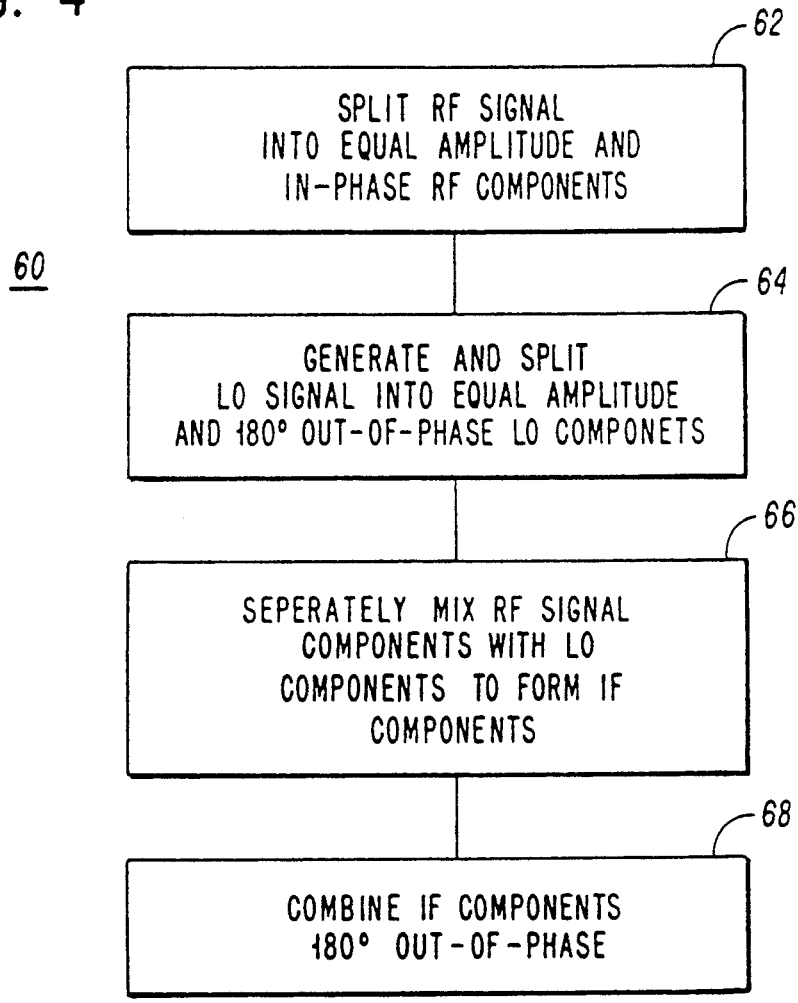
FIG. 4 provides a flow-chart of the process characteristic of the present invention showing the basic steps inherent in the operation of the present invention.

Referring now to FIG. 1, the system 10 of the present invention performs the primary mixing function for the a superheterodyne receiver while serving to suppress spurious products ordinarily generated as part of the mixing process and to reduce the level of radiation leaked due to high level local oscillator signals passing through the mixers. A communications signal RFS pick up by the antenna 12 is supplied along the line 30 to the preamplifier 14 providing a limited amount of initial gain. The signal RFS is then supplied along the line 32 to the 0° splitter 20 of system 10 of the present invention. The 0° splitter 20 splits the signal RFS into two equal amplitude and in phase radio frequency signal components RFC1 and RFC2 which are provided along the lines 34a and 34b to the mixers 22a and 22b. The mixers 22a and 22b comprise double-balanced diode mixers adapted for radio frequency operation as are well known in the art. A tunable synthesizer 24 generates a local oscillator signal LOS having a frequency selected to generate the desired intermediate frequency when the local oscillator signal LOS is mixed with the communications signal RFS. The local oscillator signal LOS is supplied along line 35 to a 180° splitter 26 which splits this signal into two equal amplitude but 180° out-of-phase components LOC1 and LOC2 which are then supplied along the lines 36a and 36b to the mixers 22a and 22b, respectively. The mixer 22a and 22b operate in a conventional fashion to mix the radio frequency communications signal component RFC1 with the local oscillator signal component LOC1 and mix the radio frequency communications signal component RFC2 with the local oscillator signal component LOC2 and thereby produce a pair of intermediate frequency components IFC1 and IFC2, respectively. The intermediate frequency signal components IFC1 and IFC2 are supplied along the lines 36a and 36b to the 180° signal combiner 28 which is functional for combining these components in an equal amplitude but 180° out-of-phase manner in order to generate a "composite" intermediate frequency signal IFS. The intermediate frequency signal IFS produced by the combiner 28 is supplied along the line 38 to the circuitry 16 comprising the rest of the receiver which is operative for processing the intermediate frequency signal and extracting the desired communications intelligence from the received signal.

In operation, the system 10 allows for the suppression of certain spurious products inherently generated pursuant to the action of the mixers 22a and 22b and further enables the level of energy radiated by the receiver due to the leakage of the local oscillator signal through the mixer to be substantially reduced.

Referring now to FIG. 2, a preferred physical implimentation is shown for the 0° splitter 20 whereby signals supplied to port A can be split into equal amplitude and in-phase components at ports B and C. The splitter 20 is implemented as a 0° hybrid having a first transformer 40 for impedance matching at port A and a second center-tapped transformer 44 which operates in conjunction with a resistor 46 for causing an equal amplitude, in-phase and lossless split of signals input at port A between ports B and C. The capacitor 42 has a small capacitance value and acts as a compensating capacitor for impedance matching the transformers 40 and 44 and extending the bandwidth of the splitter 20.

Referring now to FIG. 3, a preferred physical implimentation is shown for the both the 180° splitter 26 and the 180° combiner 28 whereby signals presented at port A may be split into equal amplitude but 180° out-of-phase components at ports B and C or signals presented at ports B and C may be combined in an equal amplitude but 180° out-of-phase fashion for supply at port A. The splitter 26 (or combiner 28) includes a first transformer 50 for impedance matching at port A and a second center-tapped transformer 52 which is operative for splitting (or combining) signals in an 180° out-of-phase manner. The resistor 54 provides a load at the center-tap of the transformer between the coils 56 and 58.

The operation of the system 10 can be mathematically analyzed with respect to a representative even ordered mixer product such as $\pm 2f_{LO} \pm 2f_{RF}$ in order to evidence the effectiveness of the system in suppressing such products. Given a radio frequency input signal RFS equal to $A\cos\omega_1 t$ and a local oscillator signal LOS equal to $B\cos\omega_2 t$ then the signal components RFC1 and RFC2 would both equal $A\sqrt{2}\cos\omega_1 t$ and the local oscillator signal components LOC1 and LOC2 would equal $B\sqrt{2}\cos\omega_2 t$ and $B\sqrt{2}\cos(\omega_2 t - 180°)$.

Accordingly, typical spurious product signals SPS1 and SPS2 generated by the mixers 22a and 22b (associated with the signals IFC1 and IFC2) could be represented by equations 2 and 3 below:

$$SPS1 = \left(\frac{A}{2}\cos^2\omega_1 t\right)\left(\frac{B}{2}\cos^2\omega_2 t\right) \tag{2}$$

$$SPS2 = \left(\frac{A}{2}\cos^2\omega_1 t\right)\left(\frac{B}{2}\cos^2\omega_2 t - 180°\right) \tag{3}$$

However, the expression shown in equations 2 and 3 can be simplified by eliminating terms which would ordinarily be expected to be outside the intermediate frequency passband of the receiver and through the application of well known trigometric identities which result in equations 4 and 5 below:

$$SPS1 = \frac{A^2 B^2}{4}\cos(2\omega_2 t - 2\omega_1 t) \tag{4}$$

$$SPS2 = \frac{A^2 B^2}{4}\cos(2\omega_2 t - 2\omega_1 t - 2(180°)) \tag{5}$$

It can be readily seen from equations 4 and 5 that SPS1~SPS2 and therefore when these signals are combined in the 180° out-of-phase combiner 28 (along with the intermediate frequency components IFC1 and IFC2) they should substantially cancel one another as shown in equation 6 below:

$$\frac{A^2 B^2}{4}\cos(2\omega_2 t - 2\omega_1 t) + \cos(2\omega_2 t - 2\omega_1 t - 360° - 180°) = 0. \tag{6}$$

On the other hand, the fundamental intermediate frequency components ($f_{LO} \pm f_{RF}$) IFC1 and IFC2 generated by the mixers 22a and 22b could be represented by equations 7 and 8 below:

$$\frac{AB}{2}\cos(\omega_2 t - \omega_1 t) \tag{7}$$

$$\frac{AB}{2}\cos(\omega_2 t - \omega_1 t - 180°) \tag{8}$$

When these signals are combined in the 180° out-of-phase combiner 28 they add together to reinforce the signal as shown in equation 9 below:

$$\frac{AB}{2}\cos(\omega_2 t - \omega_1 t) + \frac{AB}{2}\cos(\omega_2 t - \omega_1 t - 180° - 180°) = \tag{9}$$

$$AB\cos(\omega_2 t - \omega_1 t)$$

Referring now to FIG. 4, the flow chart 60 includes four steps 62, 64, 66, and 68 which represent the fundamental steps in an accordance with which the present invention may be practiced. Pursuant to step 62 a radio frequency communication signal picked up by an antenna is split into to equal amplitude and in-phase radio frequency components. Simultaneously a local oscillator signal of appropriate frequency is generated and split into equal amplitude but 180° out-of-phase components as describe in step 64. In accordance with step 66 the radio frequency signal components and the local oscillator signal components are separately mixed to form intermediate signal components. Finally, pursuant to step 68 the intermediate frequency signal components are combined in an equal amplitude but 180° out-of-phase fashion to form a composite intermediate frequency signal characterized by reduced spurious product signal levels.

Figure 5:
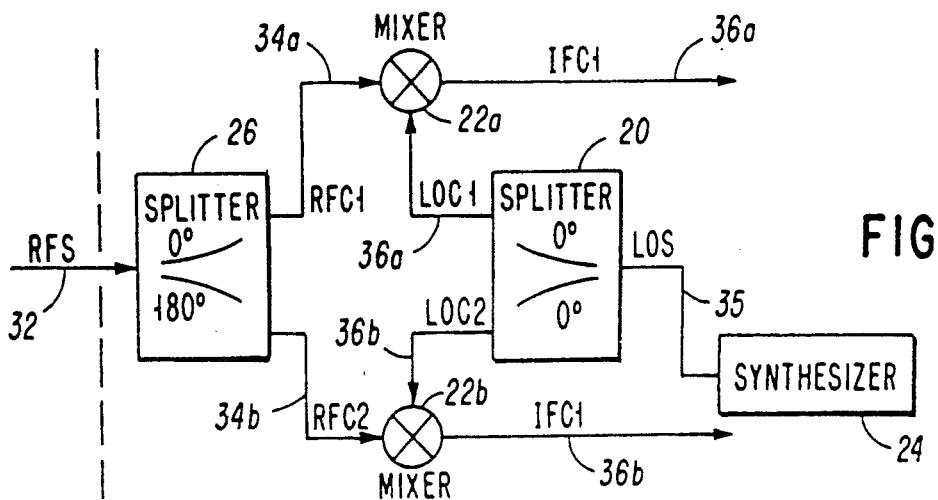
FIG. 5 provides a block diagram of an alternative embodiment of the present invention showing the configuration of the components comprising this embodiment.

While particular embodiments of the present invention have been shown and described, it should be clear that changes and modifications may be made to such embodiments without departing from the true scope and spirit of the invention. For example, the positioning of splitters 20 and 26 within the system 10 could be switched as shown in FIG. 5. In this case the splitter 26 would split the communications signal RFS into equal amplitude but 180° out-of-phase components while the splitter 20 would split the local oscillator signal LOS into equal amplitude but in-phase components with the effect being the same when these components are mixed in producing the intermediate frequency components IFC1 and IFC2. It is intended that the appended claims cover all such changes and modifications.

We claim:

1. A system for use in a radio receiver for converting radio frequency signals to intermediate frequency signals while suppressing certain spurious products and radiation arising from the leakage of local oscillator signal energy, said stream comprising:
   a 0° splitter for splitting a radio frequency communications signal into first and second radio frequency components which have equal amplitude and are in-phase;
   a synthesizer for generating a local oscillator signal having a frequency regulated in accordance with the frequency of said radio frequency signal;
   a 180° splitter for splitting said local oscillator signal into first and second local oscillator components which have equal amplitude but are 180° out-of-phase;
   a first radio frequency mixer for mixing said first radio frequency component with said first local oscillator component to produce a first intermediate frequency component;
   a second radio frequency mixer for mixing said second radio frequency component with said second local oscillator component to produce a second intermediate signal component; and
   a 180° combiner for combining said first and second intermediate signal components to form an intermediate frequency signal characterized by reduced spurious product signal levels;
   wherein the combination of the 0° splitter and the local oscillator 180° splitter combine to suppress local oscillator radiation at the input to the system due to the 180° phase difference of the first and second local oscillator components.

2. The system of claim 1, wherein said first and second radio frequency mixers comprise double-balanced diode mixers.

3. The system of claim 1, wherein said 0° splitter, 180° splitter and 180° combiner comprise 0 degree and 180 degree hybrids including center-tapped transformers as their principal elements.

4. A process for use in radio receivers for converting radio frequency signals to intermediate frequency signals while suppressing certain spurious products and local oscillator radiation, said process comprising the steps of:
   splitting a radio frequency communications signal into first and second radio frequency components which have equal amplitude and are in-phase;
   generating a local oscillator signal having a frequency regulated in accordance with the frequency of said radio frequency signal;
   splitting said local oscillator signal into first and second local oscillator components which have equal amplitude but are 180° out-of-phase;
   mixing said first radio frequency component with said first local oscillator component to produce a first intermediate frequency component;
   mixing said second radio frequency component with said second local oscillator component to produce a second intermediate signal component; and
   combining said first and second intermediate signal components to form an intermediate frequency signal characterized by reduced spurious signal product levels.

5. The process of claim 4, wherein said steps of mixing radio frequency components with local oscillator components are performed using double-balanced diode mixers.

6. The process of claims 4, wherein said steps of splitting and combining signals and components are performed using 0° and 180° hybrids including center-tapped transformers as their principal elements.

7. A system for use in a radio receiver for converting radio frequency signals to intermediate frequency signals while suppressing certain spurious products and radiation arising from the leakage of local splitter signal energy, said system comprising:
   a 180° splitter for splitting a radio frequency communications signal into first and second radio frequency components which have equal amplitude but are 180° out-of-phase;
   a synthesizer for generating a local oscillator signal having a frequency regulated in accordance with the frequency of said radio frequency signal;
   a 0° splitter for splitting said local oscillator signal into first and second oscillator components which have equal amplitude and are in-phase;
   a first radio frequency mixer for mixing said first radio frequency component with said first local oscillator component to produce a first intermediate frequency component;
   a second radio frequency mixer for mixing said second radio frequency component with said second local oscillator component to produce a second intermediate signal component; and
   a 180° combiner for combining said first and second intermediate signal components to form an intermediate frequency signal characterized by reduced spurious product signal levels;
   wherein the combination of the 180° splitter and the local oscillator 0° splitter combine to suppress local oscillator radiation at the input to the system due to the 180° phase difference of the first and second local oscillator components.

8. The system of claim 7, wherein said first and second radio frequency mixers comprise double-balanced diode mixers.

9. The system of claim 7, wherein said 0° splitter, 180° splitter and 180° combiner comprise 0 degree and 180 degree hybrids including center-tapped transformers as their principal elements.

10. A process for use in radio receivers for converting radio frequency signals to intermediate frequency signals while suppressing certain spurious products and local oscillator radiation, said process comprising the steps of:
- splitting a radio frequency communications signal into first and second radio frequency components which have equal amplitude but are 180° out-of-phase;
- generating a local oscillator signal having a frequency regulated in accordance with the frequency of said radio frequency signal;
- splitting said local oscillator signal into first and second local oscillator components which have equal amplitude but are in-phase;
- mixing said first radio frequency component with said first local oscillator component to produce a first intermediate frequency component;
- mixing said second radio frequency component with said second local oscillator component to produce a second intermediate signal component; and
- combining said first and second intermediate signal components to form an intermediate frequency signal characterized by reduced spurious signal product levels.

11. The process of claim 10, wherein said steps of mixing radio frequency components with local oscillator components are performed using double-balanced diode mixers.

12. The process of claims 10, wherein said steps of splitting and combining signals and components are performed using 0° and 180° hybrids including center-tapped transformers as their principal elements.

13. An apparatus for use in radio receivers for converting radio frequency signals to intermediate frequency signals while suppressing certain spurious products and local oscillator radiation, said apparatus comprising:
- means for splitting a radio frequency communications signal into first and second radio frequency components which have equal amplitude and are in-phase;
- means for generating a local oscillator signal having a frequency regulated in accordance with the frequency of said radio frequency signal;
- means for splitting said local oscillator signal into first and second local oscillator components which have equal amplitude but are 180° out-of-phase;
- means for mixing said first radio frequency component with said first local oscillator component to produce a second intermediate signal component; and
- means for mixing said second radio frequency component with said second local oscillator component to produce a second intermediate signal component; and
- means for combining said first and second intermediate signal components to form an intermediate frequency signal characterized by reduced spurious signal product levels;
- wherein the combination of the radio frequency splitting means and the local oscillator splitter means combine to suppress local oscillator radiation at the input to the system due to the 180° phase difference of the first and second local oscillator components.

14. The apparatus of claim 13, wherein said means for mixing radio frequency components with local oscillator components comprise double-balanced diode mixers.

15. The apparatus of claim 13, wherein said means for splitting and combining signals and components comprise 0° and 180° hybrids including center-tapped transformers as their principal elements.

* * * * *